United States Patent [19]

Chan et al.

[11] Patent Number: 5,627,094

[45] Date of Patent: May 6, 1997

[54] STACKED CONTAINER CAPACITOR USING CHEMICAL MECHANICAL POLISHING

[75] Inventors: Lap Chan; Yeow M. Teo, both of Singapore, Singapore

[73] Assignee: Chartered Semiconductor Manufacturing Pte, Ltd., Singapore, Singapore

[21] Appl. No.: 566,809

[22] Filed: Dec. 4, 1995

[51] Int. Cl.⁶ .......................... H01L 21/70; H01L 27/00
[52] U.S. Cl. ...................... 438/253; 438/396; 438/702
[58] Field of Search .......................... 437/52, 60, 919, 437/48

[56] References Cited

U.S. PATENT DOCUMENTS

| | | | |
|---|---|---|---|
| 4,577,395 | 3/1986 | Shibata | 29/576 |
| 4,833,094 | 5/1989 | Kenney | 437/47 |
| 5,026,659 | 6/1991 | Lee | 437/52 |
| 5,162,248 | 11/1992 | Dennison et al. | 437/52 |
| 5,270,241 | 12/1993 | Dennison et al. | 437/52 |
| 5,275,974 | 1/1994 | Ellol et al. | 437/203 |
| 5,292,679 | 3/1994 | Anzai | 437/52 |
| 5,354,705 | 10/1994 | Mathews et al. | 437/52 |
| 5,362,666 | 11/1994 | Dennison | 437/52 |
| 5,364,809 | 11/1994 | Kwon et al. | 437/52 |
| 5,384,152 | 1/1995 | Chu et al. | 427/81 |

*Primary Examiner*—Jey Tsai
*Attorney, Agent, or Firm*—George O. Saile; Alek P. Szecsy

[57] ABSTRACT

A method for forming a stacked container capacitor for use within integrated circuits. Formed successively upon a semiconductor substrate is a first dielectric layer, a second dielectric layer and a patterned mask layer. Within an isotropic etch process, the first dielectric layer etches slower than the second dielectric layer. By means of an anisotropic etch process employing the patterned mask layer as a mask, an aperture is etched at least partially through the first dielectric layer. By means of an isotropic etch process employing the patterned mask layer as a mask, the second dielectric layer is etched to yield a ledge formed above the first dielectric layer and below the patterned masking layer. The patterned mask layer is then removed. Formed then into the anisotropically and isotropically etched aperture is a first polysilicon layer, a third dielectric layer and a second polysilicon layer. Finally, the filled isotropically etched aperture is planarized until there is exposed a flange of the first polysilicon layer formed into the ledge.

21 Claims, 4 Drawing Sheets

STACKED CONTAINER CAPACITOR USING CHEMICAL MECHANICAL POLISHING

BACKGROUND OF THE INVENTION

1. Field of the Invention

The present invention relates generally to capacitors formed within integrated circuits. More particularly, the present invention relates to stacked container capacitors formed within integrated circuits.

2. Description of the Related Art

Well known in the art of integrated circuit memory chip design and fabrication is the single memory cell which is comprised of an access transistor which serves as a switching element through which an associated storage capacitor may be charged and discharged. The single memory cell provides an element within advanced digital integrated circuits through which large quantities of data may be stored, manipulated and retrieved.

As integrated circuit technology has advanced, and integrated circuit device dimensions have decreased, it has become increasingly important to efficiently form within advanced integrated circuits storage capacitors which comply with the conflicting requirements of high charge storage capacity and decreased physical dimensions. Storage capacitors which possess these two criteria allow continued scaling of integrated circuit device memory cells and efficient use of semiconductor substrate surface area while simultaneously providing sufficient charge storage capacity to assure integrity of data storage and retrieval without data losses due to adventitious circuit noise and related charge generation phenomena.

Methods through which there may be formed integrated circuit device memory cells, and the storage capacitors associated with those cells, are well known in the art. Most commonly, the storage capacitors within integrated circuit memory cells are formed within trenches or other apertures formed within the semiconductor substrates adjoining the transistors through which those storage capacitors are accessed. Storage capacitors formed in this location are referred to as trench storage capacitors.

Less common in the art are analogous storage capacitors which are formed within or through a dielectric layer directly above or upon the source/drain electrode of a field effect transistor which accesses that storage capacitor. When formed in this location, the storage capacitor is commonly referred to as a stacked container capacitor. Stacked container capacitors provide particularly space efficient integrated circuit memory cells. It is towards forming stacked container capacitors with fully planarized surfaces and readily accessible electrodes that the present invention is directed. Stacked container capacitors formed with those properties are most likely to be readily fabricated into advanced integrated circuits with maximum process flexibility.

The art teaches many improvements and variations upon methods for forming trench storage capacitors for use within integrated circuit device memory cells. For example, Shibata, in U.S. Pat. No. 4,577,395 teaches a multiple masking and self-aligning method for forming a trench storage capacitor which has limited susceptibility to electrical punch-through to an adjoining trench storage capacitor. In addition, Kenney, in U.S. Pat. No. 4,833,094 teaches a method for forming a mandrel shaped trench storage capacitor which rises slightly above the surface of the semiconductor substrate within which it is formed. One of the vertical electrodes of the capacitor is connected to the source/drain electrode of the transistor through which the trench storage capacitor is accessed via a novel doped polysilicon bridge element.

Further, Lee, in U.S. Pat. No. 5,026,659 teaches a method for forming a trench storage capacitor having improved electrical integrity. The method incorporates a junction implant and an oxide spacer layer at the bottom of the trench into which is formed the trench storage capacitor. Still further, Ellul et al., in U.S. Pat. No. 5,275,974 teaches a maskless method for forming electrodes for a trench storage capacitor. The method employs a trench having two separate sections of different width.

Yet further, Anzai, in U.S. Pat. No. 5,292,679 discloses a non-etching method for forming trench storage capacitors. The method provides trenches which are formed through selective growth of an epitaxial layer using a silicon oxide mask. Finally, Chu et al., in U.S. Pat. No. 5,384,152 teach a method for forming trench storage capacitors of higher capacitance. The disclosed method employs roughened capacitor plate surfaces formed through providing lattice mis-matched crystal layers upon those surfaces.

Less common in the art are disclosures relating to stacked container capacitors. Dennison et al., in U.S. Pat. Nos. 5,162,248 and 5,270,241 disclose a method for forming a stacked container capacitor which protrudes above the surface of an insulating layer into which the stacked container capacitor is formed. Fabrication of the stacked container capacitor involves a planarizing process for filling the stacked container capacitor with a sacrificial oxide.

Desirable in the art are additional improvements to stacked container capacitors. Particularly desirable are improvements which provide stacked container capacitors having a fully planarized structure in their final states, and stacked container capacitors wherein electrodes are readily accessible for connection to other electrical circuit elements within the integrated circuits within which are formed those stacked container capacitors.

SUMMARY OF THE INVENTION

A first object of the present invention is to provide a stacked container capacitor for use within an integrated circuit, which stacked container capacitor has a fully planarized surface in its final state and readily accessible electrodes.

A second object of the present invention is to provide a stacked container capacitor in accord with the first object of the present invention, which stacked container capacitor is also readily manufacturable.

A third object of the present invention is to provide a stacked container capacitor in accord with the first object of the present invention and the second object of the present invention, which stacked container capacitor may also be readily connected into an integrated circuit memory cell.

In accord with the objects of the present invention there is disclosed a new stacked container capacitor for use within an integrated circuit and a method by which the new stacked container capacitor may be formed.

To form the stacked container capacitor of the present invention there is formed upon a semiconductor substrate a first dielectric layer having a first isotropic etch rate in an isotropic etch process. Formed upon the first dielectric layer is a second dielectric layer which has a second isotropic etch rate in the same isotropic etch process. The second isotropic etch rate is greater than the first isotropic etch rate. Formed upon the second dielectric layer is a patterned mask layer. Through means of an anisotropic etch process employing the patterned mask layer as a mask there is etched at least partially through the first dielectric layer an aperture. Through means of the isotropic etch process employing the patterned mask layer as a mask there is etched the second dielectric layer to yield a ledge formed above the first dielectric layer and below the patterned masking layer. The patterned masking layer is then removed. Formed then successively into the anisotropically and isotropically etched aperture are a first polysilicon layer, a third dielectric layer and a second polysilicon layer. Neither the first polysilicon layer nor the third dielectric layer completely fills the anisotropically and isotropically etched aperture. Finally, the anisotropically and isotropically etched aperture is then planarized until there is revealed a flange of the first polysilicon layer where the first polysilicon layer is formed into the ledge.

The stacked container capacitor of the present invention has a fully planarized structure in its final state and readily accessible electrodes. The method through which is formed the stacked container capacitor of the present invention requires a planarizing process to remove excess capacitor materials from the insulating layers into which is formed the stacked container capacitor of the present invention. Simultaneously with removing those excess capacitor materials through the planarizing process, the electrodes of the stacked container capacitor of the present invention become accessible. Through isotropically etching a ledge into the aperture into which is formed the stacked container capacitor of the present invention, the stacked container capacitor of the present invention is formed with a flange which serves as an electrode of the stacked container capacitor. The flange electrode is readily accessible for connection within an integrated circuit within which the stacked container capacitor of the present invention is formed.

The stacked container capacitor of the present invention is readily manufacturable. The stacked container capacitor of the present invention requires neither any new manufacturing materials nor any new manufacturing processes for its fabrication. The stacked container capacitor of the present invention is formed through thin film deposition, masking and planarizing processes which are known in the art.

The stacked container capacitor of the present invention may be readily incorporated into an integrated circuit memory cell. By forming the stacked container capacitor of the present invention completely through an insulating layer immediately below which resides a source/drain electrode of a field effect transistor which accesses the stacked container capacitor, contact may be made directly between the source/drain electrode of the field effect transistor and an electrode of the stacked container capacitor. Remaining electrodes of the stacked container capacitor are planarized and readily available for connection within the same integrated circuit memory cell.

BRIEF DESCRIPTION OF THE DRAWINGS

The accompanying drawings, which form a material part of this disclosure, show the following.

DESCRIPTION OF THE PREFERRED EMBODIMENT

The present invention provides a stacked container capacitor which has a fully planarized surface in its final state and readily accessible electrodes. The stacked container capacitor of the present invention is formed into an anisotropically and isotropically etched aperture within a pair of adjoining dielectric layers within an integrated circuit. The anisotropically and isotropically etched aperture has a ledge formed upon the upper surface of the lower-lying dielectric layer. Formed into this ledge is a flange which forms one electrode of the stacked container capacitor of the present invention. This electrode and the remaining electrodes of the stacked container capacitor of the present invention have fully planarized surfaces and are readily accessible.

The stacked container capacitor of the present invention may be readily formed into an integrated circuit memory cell. If the dielectric layers into which is formed the stacked container capacitor of the present invention are formed directly upon a source/drain electrode of a field effect transistor, and the isotropically etched aperture within the dielectric layers, within which aperture is formed the stacked container capacitor is formed completely through the dielectric layer, the stacked container capacitor when formed within the isotropically etched aperture will contact the source/drain electrode. Since the bottom of the stacked container capacitor of the present invention forms one of the electrodes of the stacked container capacitor, electrical contact is made between the stacked container capacitor of the present invention and a field effect transistor which may be employed to access that stacked container capacitor within a memory cell.

The stacked container capacitor of the present invention may be employed within any integrated circuit wherein it is desired or required to form a stacked container capacitor within a dielectric layer. In addition, the stacked container capacitor of the present invention may also be employed in any integrated circuit memory cell where limited semiconductor substrate surface area makes it desirable to employ the stacked container capacitor of the present invention. Finally, the stacked container capacitor of the present invention may be employed within various integrated circuit device cells and integrated circuits including but not limited to Dynamic Random Access Memory (DRAM) integrated circuit device cells, Static Random Access Memory (SRAM) integrated circuit device cells, Application Specific Integrated Circuits (ASICs) integrated circuits, integrated circuits having within their fabrications field effect transistors and integrated circuits having within their fabrications bipolar transistors. The stacked container capacitor of the present invention has broad applicability within integrated circuits.

Figure 1:
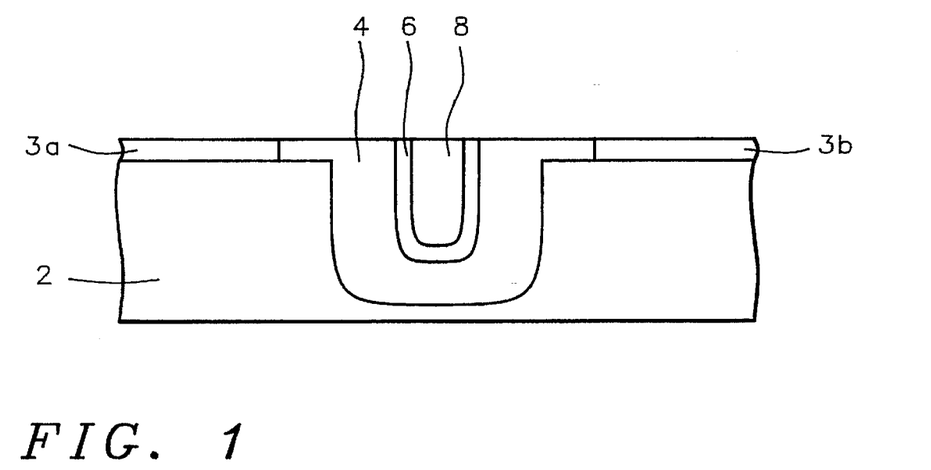
FIG. 1 shows a cross-sectional schematic diagram illustrating the stacked container capacitor of the present invention.

Referring now to FIG. 1 there is shown a schematic cross-sectional diagram generally illustrating the features of the stacked container capacitor of the present invention. Shown in FIG. 1 is a first dielectric layer 2 and second dielectric layers 3a and 3b which form the substrate into which the stacked container capacitor of the present invention is formed. The stacked container capacitor is formed from a first polysilicon layer 4, a third dielectric layer 6 and a second polysilicon layer 8. The first polysilicon layer 4 and the second polysilicon layer 8 form electrodes of the stacked container capacitor of the present invention. By isotropically etching the second dielectric layers 3a and 3b to form a wider aperture than the aperture formed within the first dielectric layer 2, the first polysilcon layer 4 forms a flange surrounding the stacked container capacitor of the present invention, which flange is an electrode of the stacked container capacitor. The flange formed from first polysilicon layer 4, and the exposed surface of second polysilicon layer 8 form the electrodes of the stacked container capacitor of the present invention.

As shown in FIG. 1, the stacked container capacitor of the present invention is formed only partially through the first dielectric layer 2. While this structure is entirely adequate for some applications of the stacked container capacitor of the present invention, in other applications it may be desirable for the stacked container capacitor of the present invention to be formed completely through the first dielectric layer 2. For example, when the first dielectric layer 2 is formed directly over a source/drain electrode of a field effect transistor which accesses the stacked container capacitor of the present invention, it may be desirable to form the stacked container capacitor of the present invention completely through the first dielectric layer 2 so that direct contact may be made between the source/drain electrode and the stacked container capacitor of the present invention.

It is also within the scope of the present invention to form a stacked container capacitor which has multiple adjoining nodes. The multiple nodes provide additional capacitance to the stacked container capacitor and provide a series of additional electrodes through which varying levels of capacitance may be shunted together. The multiple nodes of the capacitor are formed into adjoining apertures within the dielectric layers into which is formed the stacked container capacitor of the present invention. Such a multiple node stacked container capacitor forms the preferred embodiment of the present invention.

Figure 2A:
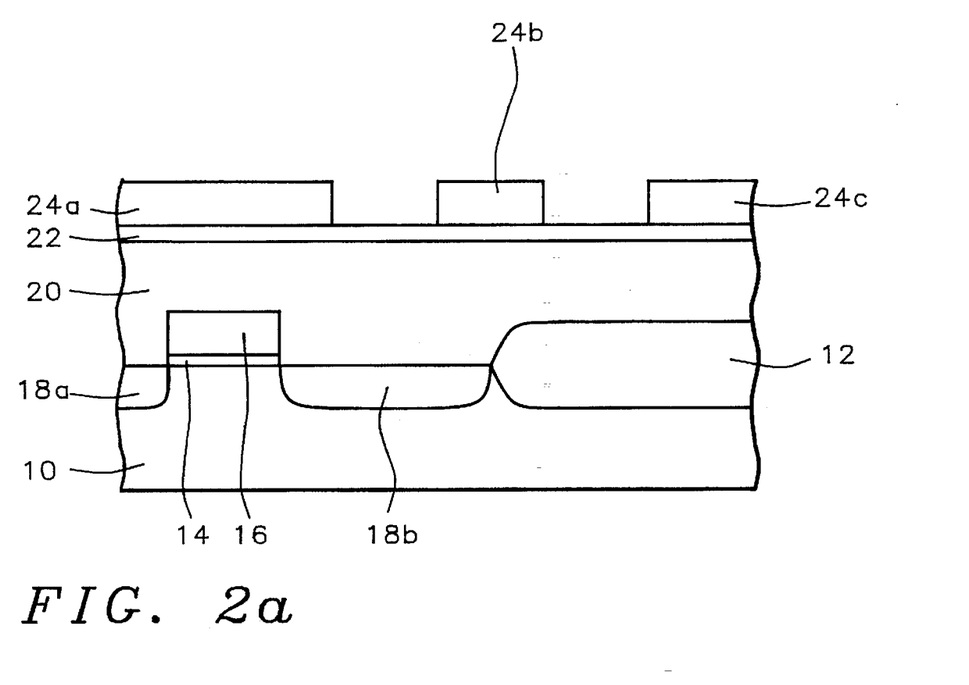
FIG. 2a to FIG. 2f show a series of schematic cross-sectional diagrams illustrating progressive stages in forming the preferred embodiment of the stacked container capacitor of the present invention formed into an integrated circuit.

Referring now to FIG. 2a to FIG. 2f there is shown a series of schematic cross-sectional diagrams illustrating progressive stages in forming the stacked container capacitor of the preferred embodiment of the present invention into a memory cell within an integrated circuit. Shown in FIG. 2a is a schematic cross-sectional diagram illustrating the early stages within the process sequence.

Shown in FIG. 2a is a semiconductor substrate 10 upon and within whose surface there is formed an isolation region 12. Semiconductor substrates upon which the present invention may be practiced may be formed with either dopant polarity, any dopant concentration and any crystallographic orientation. Typically, the semiconductor substrate 10 upon which is practiced the present invention is a N- or P- silicon semiconductor substrate having a (100) crystallographic orientation.

Methods by which isolation regions may be formed within and upon semiconductor substrates are known in the art. Such methods include but are not limited to methods whereby a portion of a semiconductor exposed through an appropriate mask is oxidized to form isolation regions within and upon the semiconductor substrate, and methods whereby a separate insulating layer is formed upon a semiconductor substrate surface and subsequently patterned to form isolation regions upon the semiconductor substrate. For the preferred embodiment of the present invention, the isolation region 12 is preferably formed through a thermal oxidation process whereby a portion of the semiconductor substrate 10 exposed through an oxidation mask is consumed to form within and upon the semiconductor substrate 10 the isolation region 12 of silicon oxide.

Also illustrated within FIG. 2a is a gate oxide 14 upon which resides a gate electrode 16. Both the gate oxide 14 and the gate electrode 16 reside upon the active semiconductor region of the semiconductor substrate 10. Both the gate oxide 14 and the gate electrode 16 are components of a field effect transistor.

Methods and materials through which gate oxides and gate electrodes may be formed upon active semiconductor regions of semiconductor substrates are known in the art. Gate oxides may be formed of methods including but not limited to methods whereby the surface of the active semiconductor region of a semiconductor substrate is oxidized to form a blanket gate oxide layer upon the active semiconductor region, and methods whereby a blanket gate oxide layer is independently deposited upon the surface of the active semiconductor region. Excess portions of blanket gate oxide layers formed upon active semiconductor regions may be removed through etching processes conventional to the art.

Gate electrodes are typically formed via patterning and etching through methods as are conventional in the art of blanket layers of gate electrode materials which are formed upon the surfaces of blanket gate oxide layers. Typically, blanket layers of gate electrode materials are formed from highly conductive materials such as metals, metal alloys, highly doped polysilicon and polycides (polysilicon/metal silicide stacks).

For the preferred embodiment of the present invention, the gate oxide 14 is preferably formed through patterning of a blanket gate oxide layer formed through thermal oxidation of the active semiconductor region of semiconductor substrate 10 at a temperature of about 800 to about 1000 degrees centigrade to yield a typical blanket gate oxide layer thickness of about 60 to about 200 angstroms. For the preferred embodiment of the present invention, the gate electrode 16 is preferably formed by patterning and etching a blanket layer of highly doped polysilicon formed upon the blanket gate oxide layer at a thickness of about 2000 to about 3500 angstroms through a Low Pressure Chemical Vapor Deposition (LPCVD) process employing silane as the silicon source material along with suitable dopant species. Once the blanket layer of highly doped polysilicon has been patterned to yield the gate electrode 16, the gate electrode 16 may be used as an etch mask to pattern the gate oxide 14 from the blanket gate oxide layer.

There is also shown in FIG. 2a source/drain electrodes 18a and 18b formed within the surface of the active semiconductor region of the semiconductor substrate 10 at areas not occupied by the gate electrode 16 and the gate oxide 14. Methods and materials through which source/drain electrodes may be formed within semiconductor substrates are known in the art. Such methods typically employ dopant species which are ionized and implanted into a semiconductor substrate at sufficient velocity and dose to form into the semiconductor substrate a region of conductivity sufficient for a source/drain electrode. The polarity desired for the source/drain electrode will dictate the polarity of the dopant species. Arsenic dopant species, boron dopant species and phosphorus dopant species are common in the art. For the preferred embodiment of the present invention, the source/drain electrodes 18a and 18b are preferably formed through implanting a suitable dopant species into the active region of the semiconductor substrate 10 at about 1E14 to about 1E16 ions per square centimeter dose and about 20 to about 100 keV ion implantation energy.

Having formed a field effect transistor structure comprising source/drain electrodes 18a and 18b formed into the semiconductor substrate 10, and a gate electrode 16 upon a gate oxide 14 adjoining the source/drain electrodes 18a and 18b the process steps in forming the stacked container capacitor of the preferred embodiment of the present invention may proceed. The results of the first of these process steps are also illustrated in FIG. 2a.

Shown upon the field effect transistor structure within FIG. 2a is a blanket planarized first dielectric layer 20, a blanket second dielectric layer 22 and patterned mask layers 24a, 24b and 24c. The patterned mask layers 24a, 24b and 24c are employed as an etch mask when patterning the blanket second dielectric layer 22 and the blanket planarized first dielectric layer 20. It is preferred for the present invention that the blanket planarized first dielectric layer 20 be formed a material which has a substantially lower isotropic etch rate than the material from which is formed the blanket second dielectric layer 22. The isotropic etch rates are determined relative to an isotropic etch process to which those two layers will subsequently be exposed. Preferably the isotropic etch rates ratio for etching the material from which is formed the blanket second dielectric layer 22 and the material from which is formed the blanket planarized first dielectric layer 20 is at least about 10:1. However, under circumstances where an isotropic etch rates ratio of at least 10:1 is not achieved, or under circumstances where a large flange is desired in the stacked container capacitor of the present invention, a two step patterning method employing a second patterned mask layer for separately and sequentially patterning the blanket second dielectric layer 22 and the blanket planarized first dielectric layer 20 may be employed.

Thus, although there are in general several methods and materials through which dielectric layers may be formed upon semiconductor substrates, the specific choices for the blanket planarized first dielectric layer 20 and the blanket second dielectric layer 22 are limited. For the preferred embodiment of the present invention, it has been found experimentally that the desired isotropic etch rates ratio condition will be met when the blanket planarized first dielectric layer 20 is formed from a dielectric material chosen from the group of dielectric materials consisting of Plasma Enhanced Chemical Vapor Deposited (PECVD) silicon oxide dielectric materials, Plasma Enhanced Chemical Vapor Deposited (PECVD) silicon nitride dielectric materials and Plasma Enhanced Chemical Vapor Deposited (PECVD) silicon oxynitride dielectric materials. Most preferably, the blanket planarized first dielectric layer 20 is formed from a Plasma Enhanced Chemical Vapor Deposited (PECVD) silicon oxide material. Preferably, the blanket planarized first dielectric layer 20 is from about 5000 to about 20000 angstroms thick. The blanket planarized first dielectric layer 20 may be planarized through methods as are conventional in the art, including but not limited to Reactive Ion Etch (RIE) etch-back planarizing methods and Chemical-Mechanical Polish (CMP) planarizing methods.

Analogously, for the preferred embodiment of the present invention, it has been found experimentally that the isotropic etch rates ratio condition will also be met when the blanket second dielectric layer 22 is simultaneously formed from a dielectric material chosen from the group of dielectric materials consisting of silicon nitride materials formed through a Low Pressure Chemical Vapor Deposition (LPCVD) method, silicon oxide materials formed through a Low Pressure Chemical Vapor Deposition (LPCVD) method, silicon oxide materials formed through an ozone assisted Chemical Vapor Deposition (CVD) method and Spin-On-Glass silicon oxide materials. Most preferably, the blanket second dielectric layer 22 is formed from a silicon nitride material formed through a Low Pressure Chemical Vapor Deposition (LPCVD) method. Preferably, the blanket second dielectric layer is from about 500 to about 3000 angstroms thick. The silicon nitride material from which is preferably formed the blanket second dielectric layer 22 serves as a sacrificial etch stop layer for a Chemical-Mechanical Planarizing (CMP) process employed later in the process of forming the stacked container capacitor of the preferred embodiment of the present invention.

The material from which is formed the patterned mask layers 24a, 24b and 24c is not critical to the present invention. Typically, however, the patterned mask layers 24a, 24b and 24c will be formed from a blanket photoresist layer which has been patterned and etched through methods as are conventional to the art. Preferably, the patterned mask layers 24a, 24b and 24c will be formed from a photoresist material which exhibits limited degradation when exposed to the anisotropic and isotropic etch processes to which those layers will subsequently be exposed.

Figure 2B:
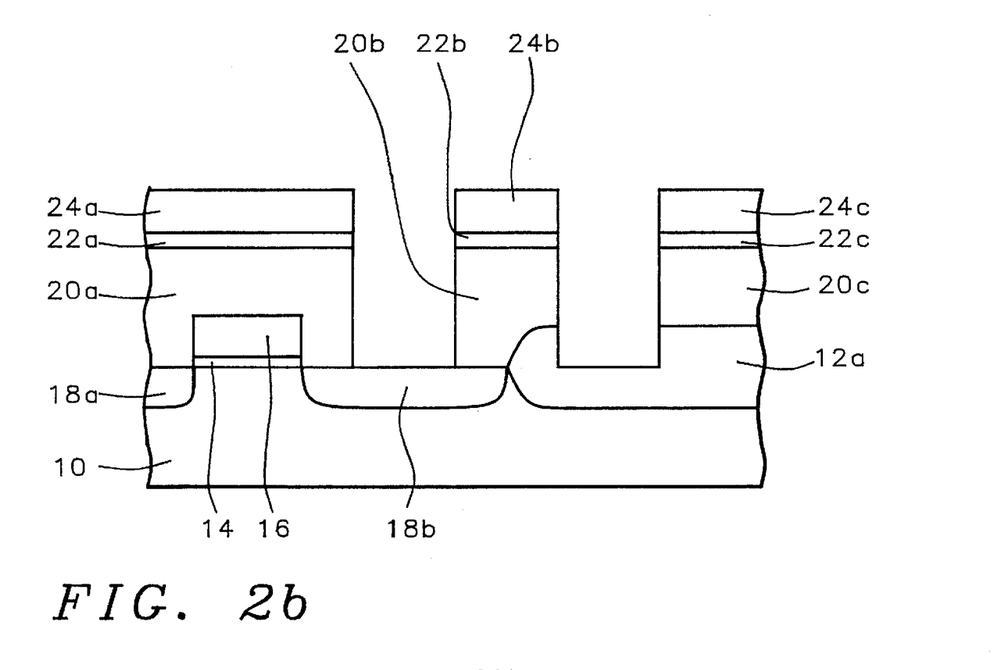

Referring now to FIG. 2b there is shown a schematic cross-sectional diagram which illustrates the results of the next process step in forming the stacked container capacitor of the preferred embodiment of the present invention. Shown in FIG. 2b is the presence of a first aperture and a second aperture formed via anisotropic etching of the blanket second dielectric layer 22 and the blanket planarized first dielectric layer 20. The anisotropic etching employs the patterned mask layers 24a, 24b and 24c as the mask. The anisotropic etching forms the patterned planarized first dielectric layers 20a, 20band 20c, and the patterned second dielectric layers 22a, 22b and 22c. The anisotropically etched apertures are etched completely through the blanket second dielectric layer 22 and the blanket planarized first dielectric layer 20. The first anisotropically etched aperture reaches the source/drain electrode 18b, and the second anisotropically etched aperture is etched into the isolation region 12 to form the etched isolation region 12a. Since the silicon substrate 10 within which is formed the source/drain electrode 18b serves as an etch stop for the first aperture but not the second aperture, it is common in the preferred embodiment of the present invention that the second aperture will be etched more deeply than the first aperture.

Several methods for anisotropically etching apertures within and through insulator layers are known in the art, including but not limited to Reactive Ion Etch (RIE) etching methods, sputter etching methods and ion milling methods. For the preferred embodiment of the present invention, the anisotropic etch method which is employed in forming the first aperture and the second aperture is preferably an anisotropic Reactive Ion Etch (RIE) etch method employing fluorine containing reactant gasses.

Figure 2C:
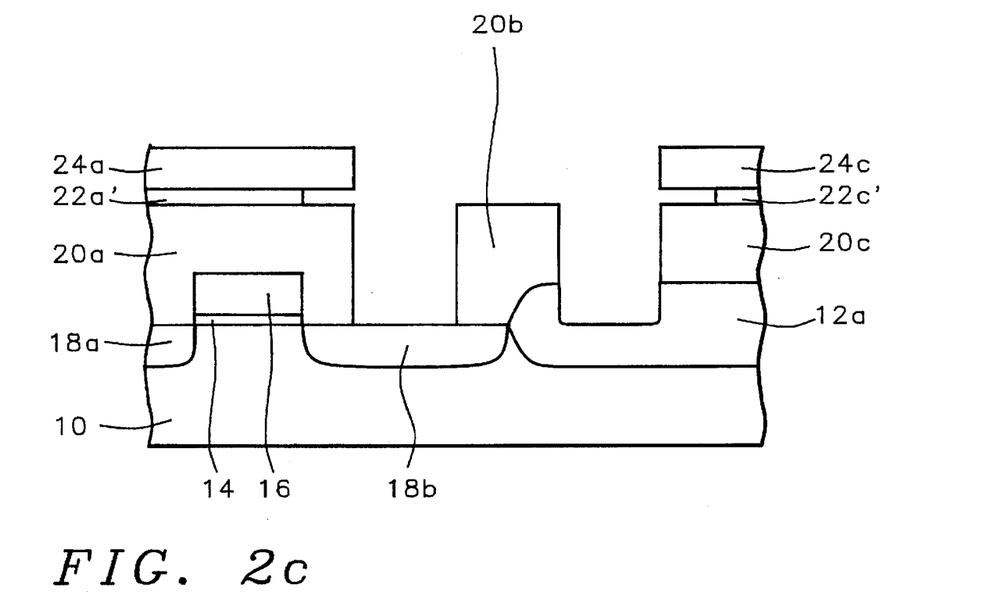

Referring now to FIG. 2c there is shown a schematic cross-sectional diagram which illustrates the results of the next process step in forming the stacked container capacitor of the preferred embodiment of the present invention. Shown in FIG. 2c are the results of an isotropic etching of the first aperture and the second aperture shown in FIG. 2b. Through exposure to the isotropic etch process, the patterned second dielectric layer 22b is completely consumed and exposed portions of the patterned second dielectric layers 22a and 22c are partially consumed to form, respectively, the patterned second dielectric layers 22a' and

22c'. In addition, the bottom of the second aperture is rounded and formed slightly more deeply into the isolation region 12a. Finally, the widths of the first aperture and the second aperture are also etched slightly larger at locations other than those occupied by the patterned second dielectric layer 22a' and the patterned second dielectric layer 22c'.

Isotropic etchants through which different materials will exhibit substantially different isotropic etch rates are known in the art. Such isotropic etchants are typically, but not exclusively wet chemical etchants which have excellent permeability into integrated circuit micro-structures. For the preferred embodiment of the present invention, the isotropic etchant is preferably a buffered oxide etchant having a concentration of about 20:1 to about 50:1. The semiconductor substrate 10 is etched in the isotropic etchant for a time period sufficient to form adequate ledges on the surfaces of the patterned planarized first dielectric layers 20a and 20b. Preferably, the widths of the ledges are at least about 1.0 micron in width and the minimum width of the isotropically etched aperture (typically corresponding to the width of the apertures between adjoining patterned planarized first dielectric layers) is at least about 1.0 micron. However, under circumstances where a large ledge is desired, a two step patterning method employing two separate patterned mask layers for separately and sequentially patterning the blanket second dielectric layer 22 and the blanket planarized first dielectric layer 20 may be employed.

As is understood by a person skilled in the art, the ordering through which the anisotropic and isotropic etch steps are undertaken in etching the blanket planarized first dielectric layer 20 and the blanket second dielectric layer 22 may be reversed under certain circumstances. In particular, the ordering through which are undertaken the anisotropic and isotropic etch steps may preferably be reversed when forming stacked container capacitors having only a single node formed into a single anisotropically and isotropically etched aperture. Under such circumstances of reversed ordering of the anisotropic and isotropic etch steps, the dimensions of the etched aperture may nonetheless typically remain substantially unchanged.

Having formed the anisotropically and isotropically etched first aperture and the anisotropically and isotropically etched second aperture, the next series of process steps in forming the stacked container capacitor of the present invention may proceed. The results of those process steps are illustrated by reference to the cross-sectional schematic diagram of FIG. 2d.

Figure 2D:
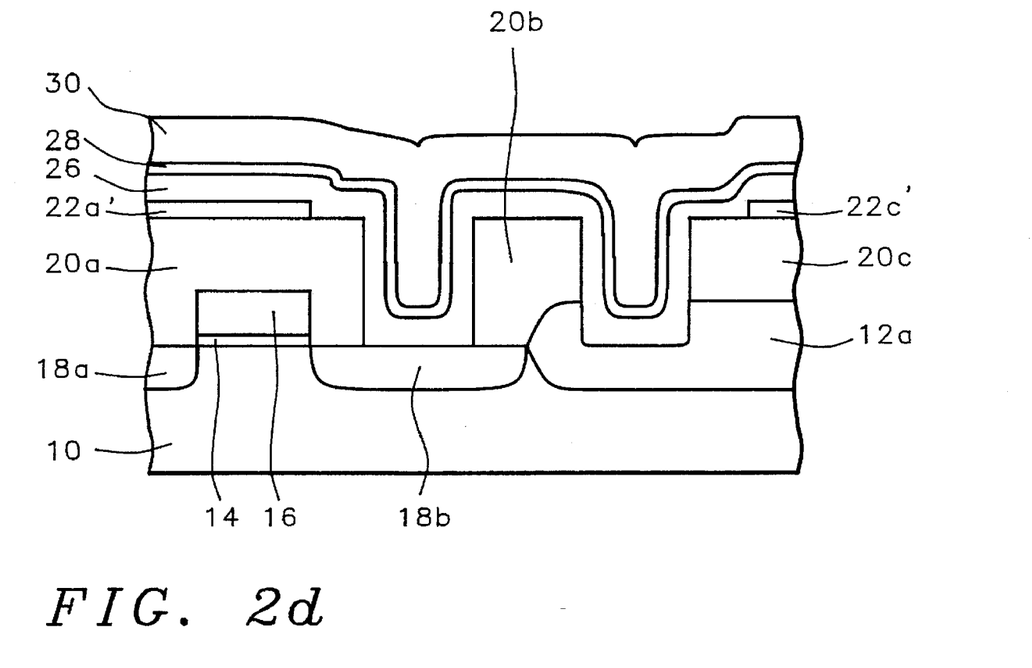

FIG. 2d shows the formation of a blanket first conformal polysilicon layer 26 upon the surface of the semiconductor substrate 10 illustrated in FIG. 2c. Upon the blanket first conformal polysilicon layer 26 is formed a blanket third dielectric layer which is also conformal. It is desirable in the present invention that both the blanket first conformal polysilicon layer 26 and the blanket third dielectric layer 28 are formed conformally into the first aperture and the second aperture. It is also desirable, however, that neither of those two layers fills either of those two apertures. In addition, it is also desirable in the present invention that the blanket first conformal polysilicon layer 26 be thicker than the patterned second dielectric layers 22a' and 22c'.

Formed upon the blanket third dielectric layer 28 is a blanket second polysilicon layer 30. It is desirable in the present invention that the blanket second polysilicon layer 30 completely fill the spaces remaining in the first aperture and the second aperture. Typically, although not necessarily, the blanket second polysilicon layer 30 will be a conformal layer.

Methods and materials through which blanket conformal polysilicon layers may be formed upon semiconductor substrates are known in the art. Such methods include but are not limited to Low Pressure Chemical Vapor Deposition (LPCVD) methods, Plasma Enhanced Chemical Vapor Deposition (PECVD) methods and Physical Vapor Deposition (PVD) sputtering methods. The Low Pressure Chemical Vapor Deposition (LPCVD) methods typically employ as silicon source materials gasses such as silane, dichlorosilane and trichlorosilane. For the preferred embodiment of the present invention, the blanket first conformal polysilicon layer 26 and the blanket second polysilicon layer 30 are preferably formed through a Low Pressure Chemical Vapor Deposition (LPCVD) process employing silane as the silicon source material along with a suitable quantity and type of dopant to make the blanket first conformal polysilicon layer 26 and the blanket second polysilicon layer 30 sufficiently conductive to serve as electrodes for the stacked container capacitor of the present invention. Preferably, the blanket first conformal polysilicon layer 26 will have a thickness of about 1000 to about 3000 angstroms and the blanket second polysilicon layer 30 will have a thickness of at least about 2000 angstroms.

Methods and materials through which conformal dielectric layers may in general be formed upon semiconductor substrates are also well known in the art. Conformal dielectric layers may be formed upon semiconductor substrates from materials including but not limited to silicon oxide materials, silicon nitride materials and silicon oxynitride materials. Conformal dielectric layers may be formed through Low Pressure Chemical Vapor Deposition (LPCVD) methods and Plasma Enhanced Chemical Vapor Deposition (PECVD) methods. For the preferred embodiment of the present invention, the blanket third dielectric layer 28 is preferably formed from either a silicon oxide material, a silicon nitride material or a silicon oxynitride material formed upon the blanket conformal first polysilicon layer 26 through a Low Pressure Chemical Vapor Deposition (LPCVD) method. The blanket third dielectric layer 28 is preferably less than about 400 angstroms thick.

Figure 2E:
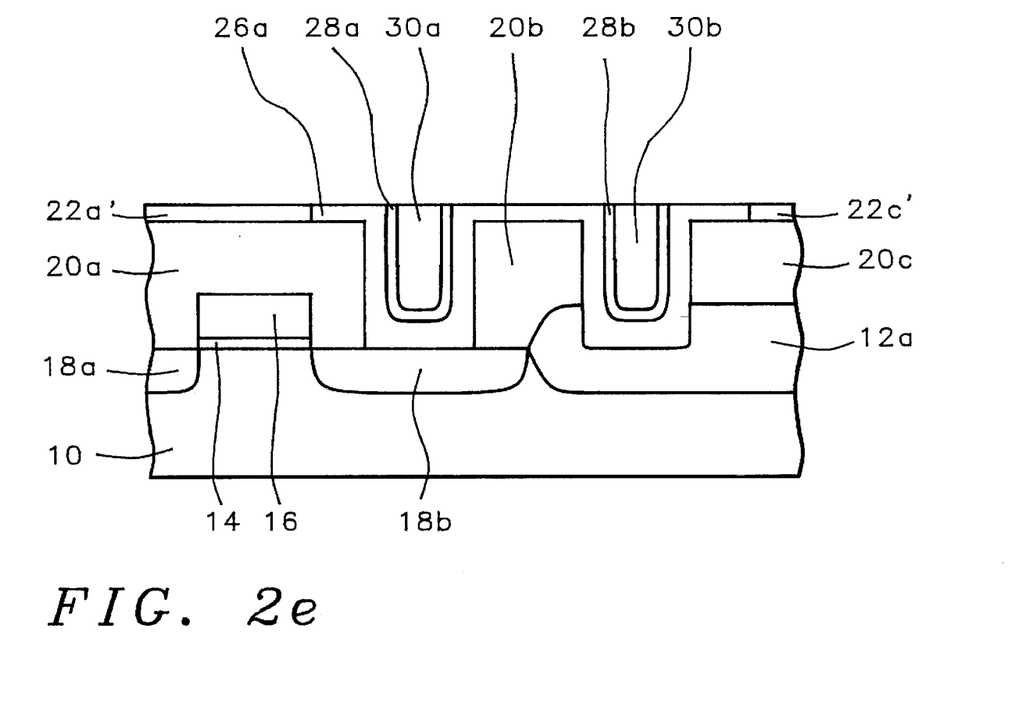

Referring now to FIG. 2e there is shown a schematic cross-sectional diagram illustrating the results of the next process step in forming the stacked container capacitor of the present invention. Shown in FIG. 2e is a planarizing of the filled first aperture and the filled second aperture illustrated in FIG. 2d. The filled first aperture and the filled second aperture are planarized until the surface of the patterned second dielectric layers 22a' and 22c' are reached. Upon completion of the planarizing process, there is exposed: (1) a planarized first polysilicon layer 26a which forms a first electrode of stacked container capacitor of the present invention, (2) planarized third dielectric layers 28a and 28b which form insulator layers within adjoining nodes of the stacked container capacitor of the present invention, and (3) planarized second polysilicon layers 30a and 30b, which form additional electrodes within individual nodes of the stacked container capacitor of the preferred embodiment of the present invention.

Methods and materials through which semiconductor surfaces may be planarized are known in the art. Typically such methods employ either a Reactive Ion Etch (RIE) etch-back planarizing method or a Chemical-Mechanical Polish (CMP) planarizing method. Due to the combination of materials that are planarized in forming the stacked container capacitor of the preferred embodiment of the present invention, it is preferred to planarize the first filled aperture and the second filled aperture using a Chemical- Mechanical Polish (CMP) planarizing process employing a silicon oxide or aluminum oxide based slurry.

Subsequent to planarizing the filled first aperture and the filled second aperture to the surfaces of the patterned second dielectric layers 22a' and 22c', the final process steps in forming the stacked container capacitor of the preferred embodiment of the present invention may proceed. The results of those process steps are illustrated in the cross-sectional schematic diagram shown in FIG. 2f.

Figure 2F:
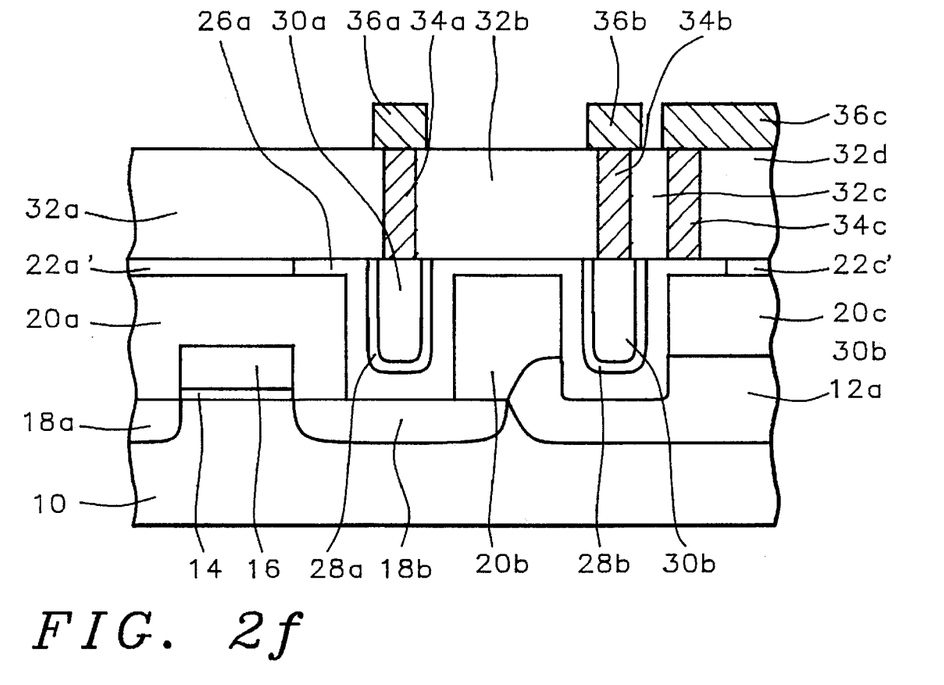

Shown in FIG. 2f are patterned fourth dielectric layers 32a, 32b, 32c and 32d. Methods and materials through which the patterned fourth dielectric layers 32a, 32b, 32c and 32d may be formed are analogous to the methods and materials through which the patterned planarized first dielectric layers 20a, 20b and 20c and the patterned second dielectric layers 22a, 22b and 22c are formed from the blanket planarized first dielectric layer 20 and the blanket second dielectric layer 22. Preferably, the patterned fourth dielectric layers 32a, 32b, 32c and 32d are formed via patterning through an anisotropic etch process of a blanket fourth dielectric layer formed upon the surface of the semiconductor substrate 10. The blanket fourth dielectric layer is preferably formed from a silicon oxide material deposited through a Chemical Vapor Deposition (CVD) method. Typically, the blanket fourth dielectric layer is about 4000 to about 15000 angstroms thick. Formed between adjoining patterned fourth dielectric layers 32a, 32b, 32c and 32d are a third aperture, a fourth aperture and a fifth aperture. The third aperture reaches the surface of the patterned second polysilicon layer 30a, the fourth aperture reaches the surface of the patterned second polysilicon layer 30b and the fifth aperture reaches the surface of the patterned first conformal polysilicon layer 26a.

Also shown in FIG. 2f are first conductive contact studs 34a, 34b and 34c which are formed, respectively, into the third aperture, the fourth aperture and the fifth aperture. Conductive contact studs are conventional to the art. Typically, although not exclusively, they are formed of highly conductive materials such as aluminum, aluminum alloys, tungsten and highly doped polysilicon. As is most common in the art, the conductive contact studs 34a, 34b and 34c of the preferred embodiment of the present invention are preferably formed of tungsten of sufficient thickness to completely fill the third aperture, the fourth aperture and the fifth aperture.

Finally, there is shown in FIG. 2f a series of patterned first metal layers 36a, 36b and 36c which make contact, respectively, with the first conductive contact studs 34a, 34b and 34c. Patterned metal layers are also conventional to the art. Patterned metal layers are typically although not exclusively formed through patterning and etching of blanket metal layers formed upon semiconductor substrates. For the preferred embodiment of the present invention, the patterned first metal layers 36a, 36b and 36c are preferably formed through patterning and etching of a blanket first metal layer formed from an aluminum containing metal alloy beneath which resides a barrier metal layer, as is common in the art. Typically, the patterned first metal layers 36a, 36b and 36c will be about 4000 to about 10000 angstroms thick each.

Upon forming the patterned first metal layers 36a, 36b and 36c upon the semiconductor substrate 10, there is formed the stacked container capacitor of the preferred embodiment of the present invention within an integrated circuit. The stacked container capacitor of the preferred embodiment of the present invention has a planarized surface in its final state and readily accessible electrodes. As illustrated by FIG. 2f, the stacked container capacitor of the present invention may be readily formed within a memory cell within an integrated circuit.

Figure 3:
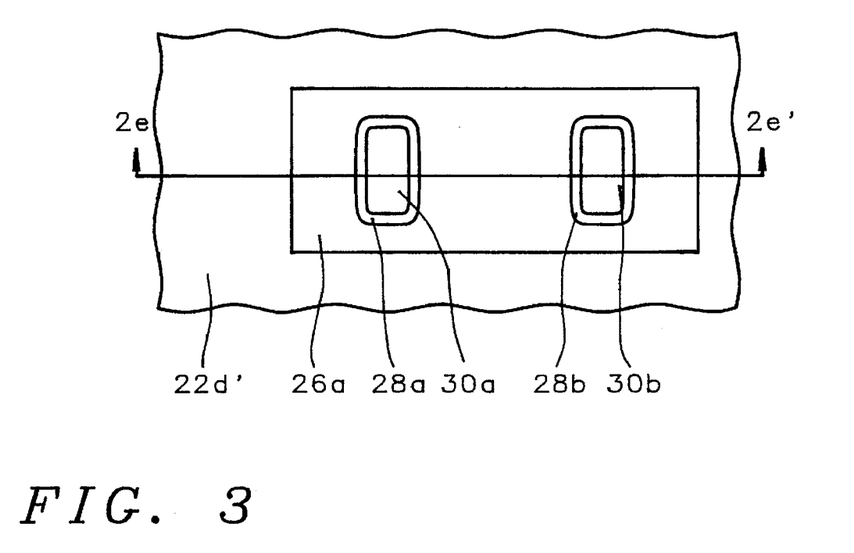
FIG. 3 shows a schematic plan-view diagram of the stacked container capacitor of the present invention corresponding to the schematic cross-sectional diagram of FIG. 2e.

Finally, there is shown in FIG. 3 a plan-view schematic diagram of the stacked container capacitor of the present invention corresponding to cross-sectional schematic diagram of FIG. 2e. Shown in FIG. 3 is a patterned second dielectric layer 22d' adjoining the planarized first polysilicon layer 26a which forms an electrode of the stacked container capacitor of the present invention. Also shown are the planarized third dielectric layers 28a and 28b which form insulator layers within individual nodes of the stacked container capacitor of the present invention. Finally, there is shown in FIG. 3 the planarized second polysilicon layers 30a and 30b which form additional electrodes within nodes of the stacked container capacitor of the present invention.

As is understood by a person skilled in the art, the preferred embodiment of the present invention is illustrative of the present invention rather than limiting of the present invention. Changes may be made to methods, materials, structures and dimensions through which is formed the preferred embodiment of the present invention while still forming an embodiment of a stacked container capacitor which is within the spirit and scope of the present invention.

What is claimed is:

1. A method for forming a stacked container capacitor for use within an integrated circuit comprising:

forming upon a semiconductor substrate a first dielectric layer having a first isotropic etch rate in an isotropic etch process;

forming upon the first dielectric layer a second dielectric layer, the second dielectric layer having a second isotropic etch rate in the isotropic etch process, the second isotropic etch rate being greater than the first isotropic etch rate;

forming a patterned mask layer upon the second dielectric layer;

anisotropically etching through the patterned mask layer an anisotropically etched aperture at least partially through the first dielectric layer, the anisotropic etching being accomplished with an anisotropic etch process;

isotropically etching through the patterned mask layer the second dielectric layer to yield an isotropically etched aperture, the isotropically etched aperture having a ledge formed above the first dielectric layer and below the patterned masking layer, the anisotropic etching and the isotropic etching together yielding a completely etched aperture;

removing then the patterned masking layer;

forming then into the completely etched aperture a first polysilicon layer, the first polysilicon layer not completely filling the completely etched aperture; forming upon the first polysilicon layer a third dielectric layer, the third dielectric layer not completely filling the completely etched aperture; forming upon the third dielectric layer a second polysilicon layer; and planarizing then the completely etched aperture until there is revealed a flange formed from the first polysilicon layer where the first polysilicon layer is formed into the ledge.

2. The method as recited in claim 1 wherein the first dielectric layer is formed from a Plasma Enhanced Chemical Vapor Deposited (PECVD) silicon oxide material.

3. The method as recited in claim 1 wherein the thickness of the first dielectric layer is from about 5000 to about 20000 angstroms.

4. The method as recited in claim 1 wherein the second dielectric layer is formed from a Low Pressure Chemical Vapor Deposited (LPCVD) silicon nitride material.

5. The method as recited in claim 1 wherein the second dielectric layer is from about 500 to about 3000 angstroms thick.

6. The method as recited in claim 1 wherein the isotropic etch rates ratio of the second isotropic etch rate to the first isotropic etch rate is at least about 10:1.

7. The method as recited in claim 1 wherein the anisotropic etch process is a Reactive Ion Etch (RIE) etch process employing fluorine containing reactant gases.

8. The method as recited in claim 1 wherein the isotropic etch process is a wet chemical etch process employing a buffered oxide etchant at a concentration of about 20:1 to about 50:1.

9. The method as recited in claim 1 wherein the width of the ledge is at least about 1.0 microns.

10. The method as recited in claim 1 wherein the minimum width of the completely etched aperture is at least about 1.0 microns.

11. The method as recited in claim 1 wherein the thickness of the first polysilicon layer is from about 1000 to about 3000 angstroms.

12. The method as recited in claim 1 wherein the thickness of the third dielectric layer is less than about 400 angstroms.

13. The method as recited in claim 1 wherein the third dielectric layer is formed from a material chosen from the group of materials consisting of silicon oxide materials, silicon nitride materials and silicon oxynitride materials.

14. The method as recited in claim 1 wherein the thickness of the second polysilicon layer is at least about 2000 angstroms.

15. The method as recited in claim 1 wherein the planarizing is accomplished through a Chemical-Mechanical Polishing (CMP) process.

16. The method as recited in claim 1 further comprising a second patterned mask layer for separately and sequentially patterning the ledge in the second dielectric layer.

17. A method for forming a stacked container capacitor within an integrated circuit memory cell comprising:

forming upon a semiconductor substrate a field effect transistor structure comprising a gate oxide, a gate electrode and at least one source/drain electrode;

forming upon the semiconductor substrate a first dielectric layer having a first isotropic etch rate in an isotropic etch process;

forming upon the first dielectric layer a second dielectric layer, the second dielectric layer having a second isotropic etch rate in the isotropic etch process, the second isotropic etch rate being greater than the first isotropic etch rate;

forming a patterned mask layer upon the second dielectric layer, a pattern of the patterned mask layer corresponding to location of the source/drain electrode;

anisotropically etching through the pattern of the patterned mask layer an aperture completely through the first dielectric layer to reach the surface of the source/drain electrode, the anisotropic etching being accomplished with an anisotropic etch process;

isotropically etching through the patterned mask layer the second dielectric layer to yield an isotropically etched aperture, the isotropically etched aperture having a ledge formed above the first dielectric layer and below the patterned masking layer, the anisotropic etching and the isotropic etching together yielding a completely etched aperture;

removing then the patterned masking layer;

forming then into the completely etched aperture a first polysilicon layer, the first polysilicon layer not completely filling the completely etched aperture;

forming upon the first polysilicon layer a third dielectric layer, the third dielectric layer not completely filling the completely etched aperture;

forming upon the third dielectric layer a second polysilicon layer; and planarizing then the completely etched aperture until there is revealed a flange formed from the first polysilicon layer where the first polysilicon layer is formed into the ledge.

18. The method as recited in claim 17 wherein the first dielectric layer is formed from a Plasma Enhanced Chemical Vapor Deposited (PECVD) silicon oxide material formed at a thickness of about 5000 to about 20000 angstroms.

19. The method as recited in claim 17 wherein the second dielectric layer is formed from a Low Pressure Chemical Vapor Deposited (LPCVD) silicon nitride material formed at a thickness of about 500 to about 3000 angstroms.

20. The method as recited in claim 17 wherein the ratio of the second isotropic etch rate to the first isotropic etch rate is at least about 10:1, the width of the ledge is at least about 1.0 micron and the minimum width of the completely etched aperture is at least about 1.0 micron.

21. The method as recited in claim 17 wherein the thickness of the first polysilicon layer is from about 1000 to about 3000 angstroms, the thickness of the third dielectric layer is less than about 400 angstroms and the thickness of the second polysilicon layer is at least about 2000 angstroms.

* * * * *